(12) United States Patent
Kim

(10) Patent No.: US 8,848,443 B2
(45) Date of Patent: Sep. 30, 2014

(54) SEMICONDUCTOR MEMORY DEVICE AND REPAIR METHOD THEREOF

(75) Inventor: Saeng-Hwan Kim, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 374 days.

(21) Appl. No.: 13/205,780

(22) Filed: Aug. 9, 2011

(65) Prior Publication Data

US 2012/0273843 A1 Nov. 1, 2012

(30) Foreign Application Priority Data

Apr. 29, 2011 (KR) .................. 10-2011-0040776

(51) Int. Cl.
| | | |
|---|---|---|
| G11C 29/04 | (2006.01) | |
| G11C 7/00 | (2006.01) | |
| H01L 25/065 | (2006.01) | |
| H01L 27/105 | (2006.01) | |
| H01L 25/18 | (2006.01) | |
| H01L 23/525 | (2006.01) | |
| H01L 25/00 | (2006.01) | |

(52) U.S. Cl.
CPC ......... *H01L 27/1052* (2013.01); *H01L 23/5256* (2013.01); *H01L 25/50* (2013.01); *H01L 25/0657* (2013.01); *H01L 2225/06596* (2013.01); *H01L 2924/0002* (2013.01); *H01L 27/105* (2013.01); *H01L 25/18* (2013.01)
USPC ................. 365/185.09; 365/185.17; 365/200; 365/225.7; 257/209; 257/529; 257/E21.211; 257/E23.149; 438/4

(58) Field of Classification Search
USPC .................... 365/185.09, 185.17, 200, 225.7; 257/209, 529, E21.211, E23.149; 438/4
See application file for complete search history.

(56) References Cited

U.S. PATENT DOCUMENTS

| 8,503,258 B2 * | 8/2013 | Keeth et al. .................... 365/200 |
| 2010/0214812 A1 | 8/2010 | Kim |
| 2011/0205796 A1 * | 8/2011 | Kim .......................... 365/185.09 |

FOREIGN PATENT DOCUMENTS

| KR | 1020000060983 | 10/2000 |
| KR | 1020060122610 | 11/2006 |
| KR | 1020090078628 | 7/2009 |
| KR | 1020100095515 | 8/2010 |

OTHER PUBLICATIONS

Preliminary Rejection issued by the Korean Intellectual Property Office on Feb. 26, 2013.
Office Action issued by the Korean Intellectual Property Office on Aug. 17, 2012.

* cited by examiner

*Primary Examiner* — Dao H Nguyen
(74) *Attorney, Agent, or Firm* — IP & T Group LLP

(57) ABSTRACT

A semiconductor memory device includes at least one first semiconductor chip including a plurality of memory cells and a second semiconductor chip including a fuse circuit configured to repair defective cells among the memory cells of the at least one first semiconductor chip.

5 Claims, 6 Drawing Sheets

US 8,848,443 B2

SEMICONDUCTOR MEMORY DEVICE AND REPAIR METHOD THEREOF

CROSS-REFERENCE TO RELATED APPLICATIONS

The present application claims priority of Korean Patent Application No. 10-2011-0040776, filed on Apr. 29, 2011, which is incorporated herein by reference in its entirety.

BACKGROUND

1. Field

Exemplary embodiments of the present invention relate to a semiconductor design technology, and more particularly, to a semiconductor memory device and a repair method thereof.

2. Description of the Related Art

Semiconductor memory devices including Dynamic Random Access Memory (DRAM) may use a stacked structure where a plurality of memory chips are piled up vertically. Semiconductor memory devices of this type are referred to as three-dimensional (3D) stack package semiconductor memory devices. With the stack package structure, semiconductor memory devices may have a high integration degree and large capacity, where the size of the semiconductor memory devices may be reduced and an interface with high frequency band width may be enabled.

Here, the stacked memory chips include memory cells that are each formed of a cell transistor and a cell capacitor. Among memory cells of a memory chip, a memory cell with defect ("a defective cell") may occur. The presence of a defective cell decreases the yield of a semiconductor memory device. Here, memory cell defects may occur as semiconductor memory devices become highly integrated, shrink in sizes, increase in capacity, and operate at an increasingly lower power source level, where the line widths of circuitry are decreased in proportion and a number of the procedural steps and the complexity thereof are increased.

In repairing a defective cell and increasing the yield of a semiconductor memory device, a spare memory cell for each memory chip and is often provided to replace a defective cell with the spare memory cell. More specifically, a spare cell ("a redundancy cell" hereinafter) is prepared before a test is performed on memory cells to detect a defective memory cell and then after the test, any defective cell is repaired by being replaced with the redundancy cell.

FIG. 1 is a block diagram illustrating a conventional semiconductor memory device.

Referring to FIG. 1, the conventional semiconductor memory device 100 includes first to fourth memory chips 110, 120, 130 and 140 that are stacked vertically. The relative roles of the first to fourth memory chips 110, 120, 130 and 140 with respect to each other are decided according to the stacking sequence. For example, the fourth memory 140 that is stacked in the lowermost position and coupled with the external circuits operates as a master chip, and the other chips sequentially stacked on top of the fourth memory 140 (the first to third memory chips 110, 120 and 130) serve as slave chips which perform a desired operation under the control of the master chip.

According to an example, since the internal structures of the first to fourth memory chips 110, 120, 130 and 140 are all the same, the first memory chip 110 is representatively described hereinafter.

The first memory chip 110 includes a plurality of first memory cells 112A and 112B for storing data, a plurality of first redundancy cells 114A and 114B for replacing defective cells among the multiple first memory cells 112A and 112B, and first fuse circuits 116A and 116B for programming an address for switching the address of a defective cell with the address of a redundancy cell. Here, the first fuse circuits 116A and 116B include a plurality of fuses, and the address program is performed through a fuse cutting process.

Hereinafter, a method for repairing the conventional semiconductor memory device having the above-described structure is described with reference to FIG. 2.

FIG. 2 is a flowchart describing a method for repairing the conventional semiconductor memory device.

Referring to FIG. 2, in the state that the first to fourth memory chips 110, 120, 130 and 140 are fabricated, the first to fourth memory chips 110, 120, 130 and 140 are tested at a wafer level to find out where there is a defective cell or not in step S10. For example, data is stored in the first memory cells 112A and 112B included in the first memory chip 110 and then the stored data is read back. In this way, the first memory cells 112A and 112B are tested to determine whether there is a defective cell or not.

In step S20, after the test, the addresses of defective cells are stored for each memory chip based on the test result.

In this state, the fuses included in the first fuse circuits 116A and 116B of the first memory chip 110 are programmed with an address in response to the stored addresses for each memory chip. For example, the address programming may be performed by performing a fuse cutting process with a laser. When the address programming is performed through the fuse cutting process, the defective cells existing in the first memory cells 112A and 112B may be replaced with the first redundancy cells 114A and 114B. Accordingly, the first redundancy cells 114A and 114B may be used instead of the defective cells in the first memory cells 112A and 112B in performing operations directed to the defective cells.

Subsequently, the fuses included in the second to fourth memory chips 120, 130 and 140 are sequentially programmed in steps S40, 50 and 60 using the same method for programming the fuses included in the first memory chip 110.

Subsequently, at step S70, the first to fourth memory chips 110, 120, 130 and 140 are vertically stacked and thus, the fabrication of the semiconductor memory device 100 is completed.

However, since the process of programming addresses in the fuses included in the first to fourth memory chips 110, 120, 130 and 140 is performed for each memory chip in the conventional semiconductor memory device 100 by accessing each memory chip separately in programming its respective fuses, the cost and time for the process thereof may be significant.

SUMMARY

An embodiment of the present invention is directed to a semiconductor memory device with a simple repairing process, and a repairing method thereof.

In accordance with an embodiment of the present invention, a semiconductor memory device include: at least one first semiconductor chip including a plurality of memory cells; and a second semiconductor chip including a fuse circuit configured to repair defective cells among the memory cells of the at least one first semiconductor chip.

In accordance with another embodiment of the present invention, a method for repairing a semiconductor memory device including a plurality of memory cells disposed in a plurality of first semiconductor memory chips and a fuse circuit for repairing defective cells among the memory cells, where the first semiconductor memory chips are different from a second memory chip including the fuse circuit, includes: testing memory cells included in each of the plurality of first semiconductor chips; and programming the fuse circuit included in the second semiconductor chip based on a result of the testing of the first semiconductor chips.

In accordance with yet another embodiment of the present invention, a method for repairing a semiconductor memory device including a plurality of memory cells disposed in a plurality of first semiconductor memory chips and a fuse circuit for repairing defective cells among the memory cells, where the first semiconductor memory chips are different from a second memory chip including the fuse circuit, includes: vertically stacking the plurality of first semiconductor chips; testing the memory cells included in each of the stacked first semiconductor chips; and programming the fuse circuit included in the second semiconductor chip based on a result of the testing of the first semiconductor chips.

DETAILED DESCRIPTION

Figure 1:
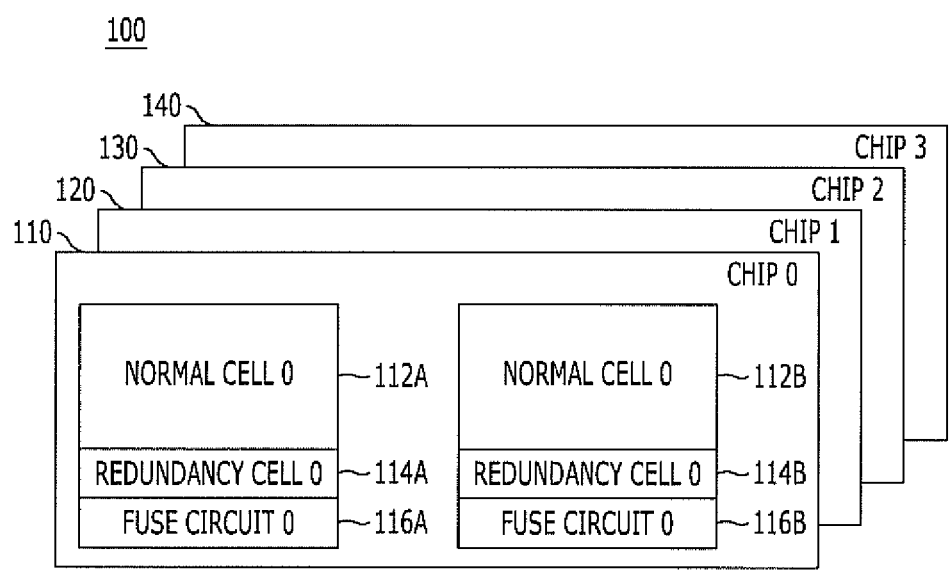
FIG. 1 is a block diagram illustrating a conventional semiconductor memory device.
Figure 2:
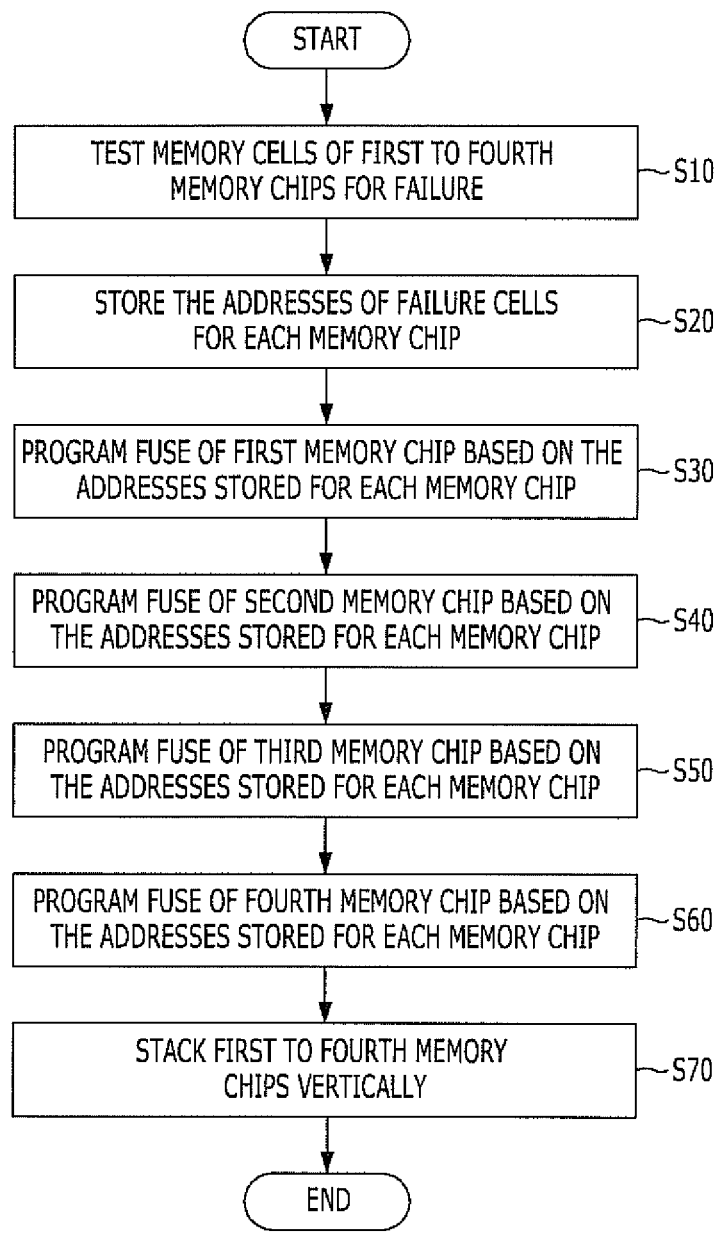
FIG. 2 is a flowchart illustrating a method for repairing the conventional semiconductor memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

For illustration purposes, a semiconductor memory device including four semiconductor chips stacked together in accordance with an embodiment of the present invention is described.

Hereinafter, a semiconductor chip including memory cells may be referred to as a memory chip and a semiconductor chip including a fuse circuit may be referred to as a repair chip.

Figure 3:
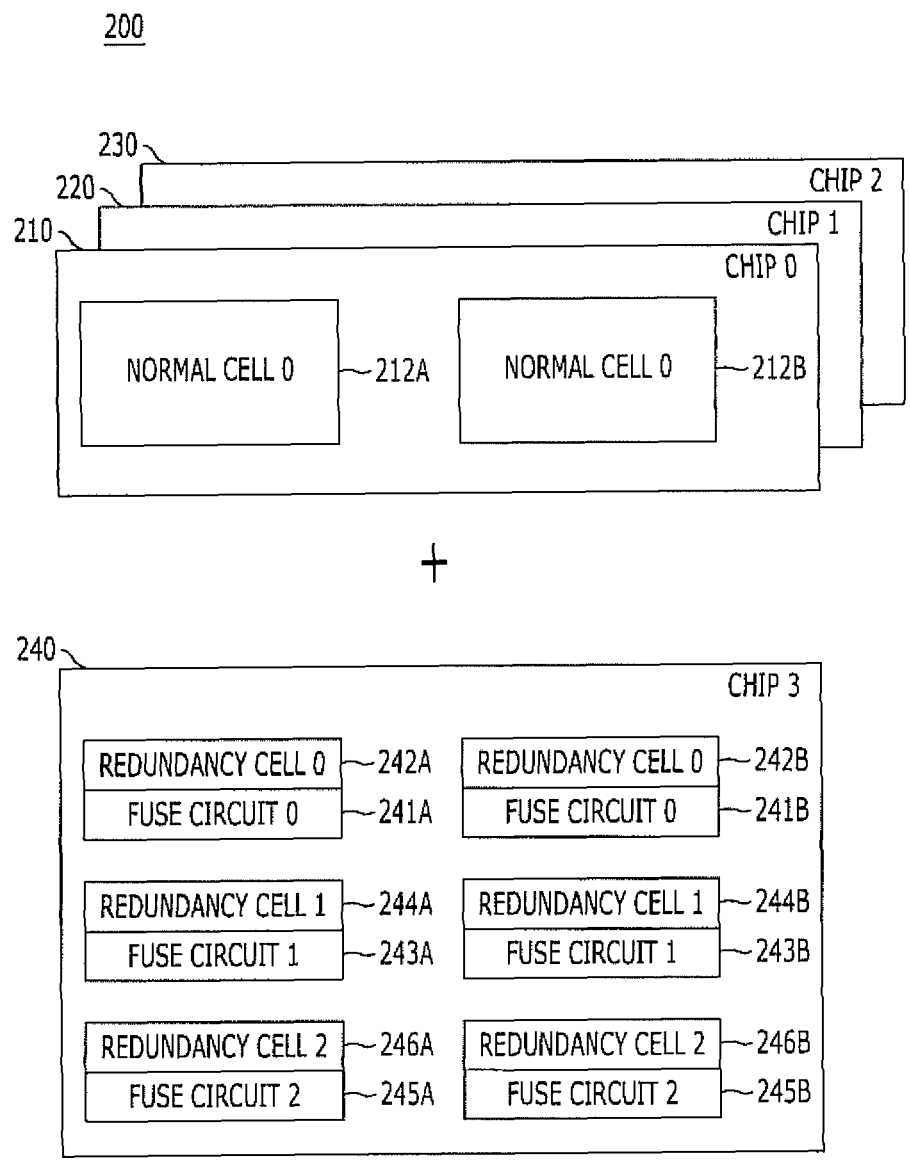
FIG. 3 is a block diagram illustrating a semiconductor memory device in accordance with a first embodiment of the present invention.
Figure 4:
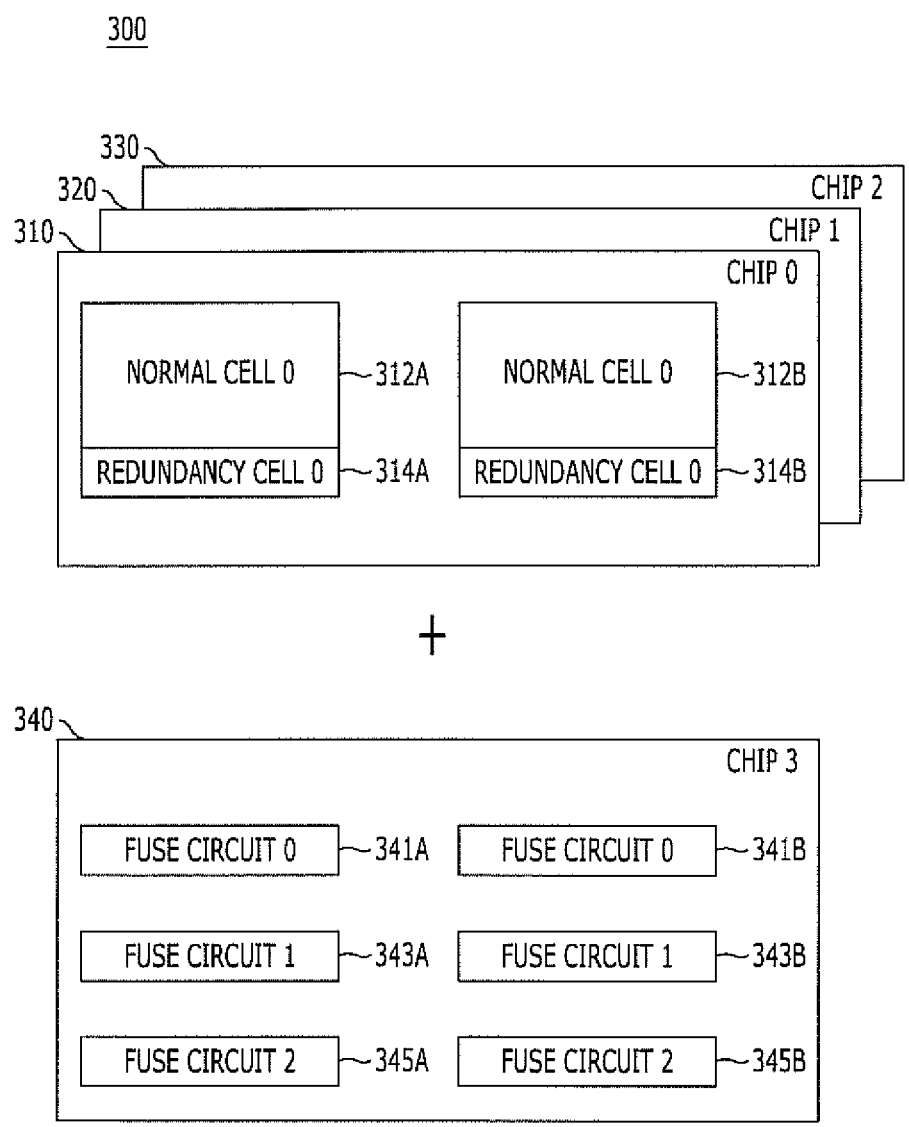
FIG. 4 is a block diagram illustrating a semiconductor memory device in accordance with a second embodiment of the present invention.

FIG. 3 is a block diagram illustrating a semiconductor memory device in accordance with a first embodiment of the present invention, and FIG. 4 is a block diagram illustrating a semiconductor memory device in accordance with a second embodiment of the present invention.

First, referring to FIG. 3, the semiconductor memory device 200 includes first to third memory chips 210, 220 and 230 and one repair chip 240. The semiconductor memory device 200 has a three-dimensional (3D) stacked structure where the first to third memory chips 210, 220 and 230 and the repair chip 240 are vertically stacked. Here, the repair chip 240 is stacked in the uppermost position or the lowermost position to function as a master chip for controlling the first to third memory chips 210, 220 and 230. The first to third memory chips 210, 220 and 230 are sequentially stacked under or on top of the repair chip 240 and function as slave chips under the control of the repair chip 240.

Here, the first memory chip 210 includes a plurality of memory cells 212A and 212B. Although not illustrated in the drawings, the second memory chip 220 includes a plurality of memory cells 222A and 222B, and the third memory chip 230 includes a plurality of memory cells 232A and 232B. For example, each of the memory cells 212A and 212B, 222A and 222B, and 232A and 232B includes a cell transistor and a cell capacitor and stores corresponding data.

The repair chip 240 includes first fuse circuits 241A and 241B, a plurality of first redundancy memory cells 242A and 242B, second fuse circuits 243A and 243B, a plurality of second redundancy memory cells 244A and 244B, third fuse circuits 245A and 245B, and a plurality of third redundancy memory cells 246A and 246B.

The first fuse circuits 241A and 241B repair memory cells with defects ("defective cells" hereinafter") among the memory cells 212A and 212B included in the first memory chip 210. The first redundancy cells 242A and 242B replace the defective cells included in the first memory chip 210. The second fuse circuits 243A and 243B repair the defective cells among a plurality of memory cells 222A and 222B included in the second memory chip 220. The second redundancy cells 244A and 244B replace the defective cells included in the second memory chip 220.

The third fuse circuits 245A and 245B repair the defective cells among a plurality of memory cells 232A and 232B included in the third memory chip 230. The third redundancy cells 246A and 246B replace the defective cells included in the third memory chip 230.

Meanwhile, in the first embodiment of the present invention, a case where the repair chip 240 includes the first to third redundancy cells 242A and 242B, 244A and 244B, and 246A and 246B is described as an example only, and the present invention is not limited thereto. According to another example, the first to third redundancy cells 242A and 242B, 244A and 244B, and 246A and 246B may be included in the corresponding memory chips 210, 220 and 230, respectively, as illustrated in FIG. 4.

Referring to FIG. 4, first redundancy cells 314A and 314B are included in a first memory chip 310. Here, although not illustrated in the drawing, second redundancy cells 324A and 324B are included in a second memory chip 320, and third redundancy cells 334A and 334B are included in a third memory chip 330. Here, since the constituent elements not illustrated in FIG. 4 are the same as those of FIG. 3 except that redundancy cells are included in memory chips for the FIG. 4 circuit instead of being included in a repair chip as shown in the FIG. 3 circuit, further description thereof is omitted for illustration purposes.

Hereinafter, the repair method for the semiconductor memory devices 200 and 300 having the above-described structures in accordance with the first and second embodiments of the present invention are described with reference to FIGS. 5 and 6, respectively.

Here, since the repairing method for the semiconductor memory devices 200 and 300 in accordance with the first and second embodiments of the present invention are the same even though the location of redundancy cells are different between the semiconductor memory devices 200 and 300, the repair method of the semiconductor memory device 200 in accordance with the first embodiment of the present invention is described below as an example.

Figure 5:
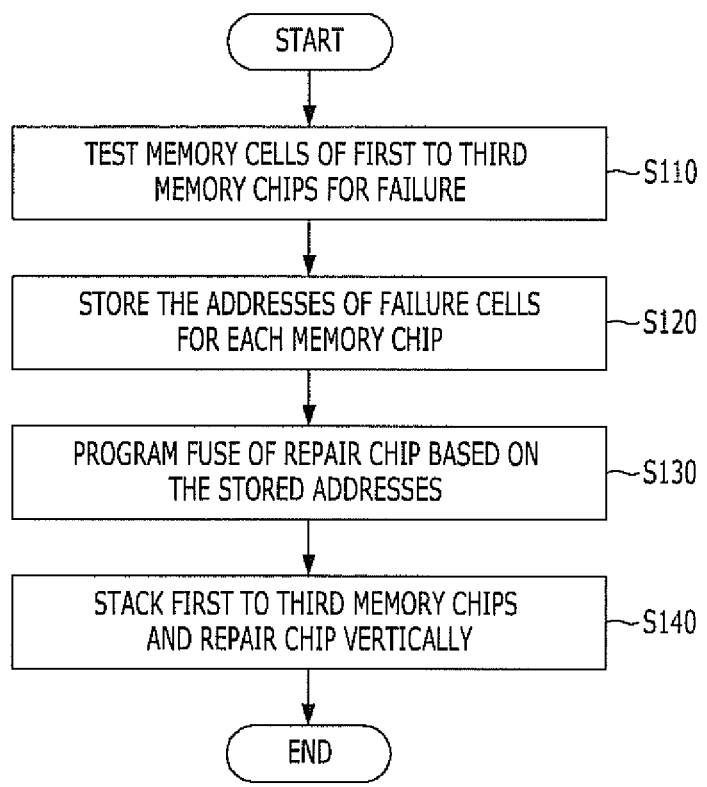
FIG. 5 is a flowchart illustrating a repair method for the semiconductor memory devices of FIGS. 3 and 4 in accordance with an embodiment of the present invention.

First, FIG. 5 is a flowchart illustrating a repair method for the semiconductor memory device 200.

Referring to FIG. 5, a wafer-level test is performed on the first to third memory chips 210, 220 and 230 in step S110. More specifically, the memory cells 212A and 212B included in the first memory chip 210, memory cells 222A and 222B included in the second memory chip 220, and memory cells 232A and 232B included in the third memory chip 230 are tested to determine if there is a defect or not.

In step S120, the addresses of the defective cells of each memory chip are stored based on the test results.

In this state, the first to third fuse circuits 241A and 241B, 243A and 243B, and 245A and 245B included in the repair chip 240 are programmed all at once in step S130 based on the addresses of the defective cells that are, for example, previously stored for each memory chip. Such programming results in switching the addresses of the defective cells of each memory chip with the addresses of the first to third redundancy cells 242A and 242B, 244A and 244B, and 246A and 246B. For example, the fuses included in the first fuse circuits 241A and 241B are cut based on the addresses of the defective cells included in the first memory chip 210, and the fuses included in the second fuse circuits 243A and 243B are cut based on the addresses of the defective cells included in the second memory chip 220. The fuses included in the third fuse circuits 245A and 245B are cut based on the addresses of the defective cells included in the third memory chip 230. Here, since the first to third fuse circuits 241A and 241B, 243A and 243B, and 245A and 245B are all included in, for example, one repair chip 240, they may be programmed all at one step without accessing different chips.

Subsequently, the first to third memory chips 210, 220 and 230 and the repair chip 240 are stacked vertically and a package process is performed in step S140 so as to complete the fabrication of the semiconductor memory device 200. Here, when defective cells are detected for each memory chip during a normal operation of the semiconductor memory device 200 involved in a read/write operation, the first to third fuse circuits 241A and 241B, 243A and 243B, and 245A and 245B replace the defective cells with the first to third redundancy cells 242A and 242B, 244A and 244B, and 246A and 246B.

Figure 6:
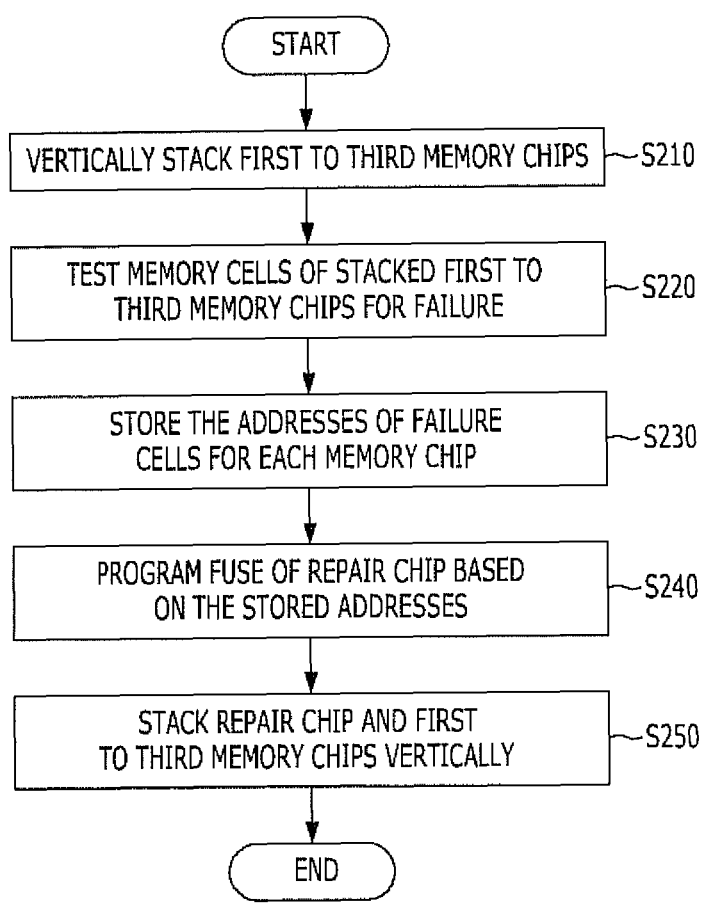
FIG. 6 is a flowchart illustrating a repair method that is applicable to the semiconductor memory devices of FIGS. 3 and 4 in accordance with another embodiment of the present invention.

FIG. 6 is a flowchart describing a repair method for the semiconductor memory device 200 in accordance with another embodiment of the present invention.

Referring to FIG. 6, after the first to third memory chips 210, 220 and 230 are vertically stacked in step S210, at step S220, each of the stacked first to third memory chips 210, 220 and 230 are tested. More specifically, the memory cells 212A and 212B included in the first memory chip 210, the memory cells 222A and 222B included in the second memory chip 220, and the memory cells 232A and 232B included in the third memory chip 230 are tested to determine whether there is a defect or not.

In step S230, the addresses of the defective memory cells detected for each memory chip are stored based on the test results.

Subsequently, in step S240, the first to third fuse circuits 241A and 241B, 243A and 243B, and 245A and 245B included in the repair chip 240 are programmed all at one step based on the addresses of the defective cells memorized for each memory chip. This process results in switching the addresses of the defective cells of each memory chip with the addresses of the first to third redundancy cells 242A and 242B, 244A and 244B, and 246A and 246B. For example, the fuses included in the first fuse circuits 241A and 241B are cut based on the addresses of the defective cells included in the first memory chip 210, and the fuses included in the second fuse circuits 243A and 243B are cut based on the addresses of the defective cells included in the second memory chip 220. The fuses included in the third fuse circuits 245A and 245B are cut based on the addresses of the defective cells included in the third memory chip 230. Here, since the first to third fuse circuits 241A and 241B, 243A and 243B, and 245A and 245B are all included in, for example, one repair chip 240, they may be programmed together without accessing different repair chips.

Subsequently, the first to third memory chips 210, 220 and 230 and the repair chip 240 are stacked vertically and a package process is performed in step S250 so as to complete the fabrication of the semiconductor memory device 200. Here, when the defective cells detected for each memory chip of the semiconductor memory device 200 are accessed in a read/write operation, the first to third fuse circuits 241A and 241B, 243A and 243B, and 245A and 245B replace the defective cells with the first to third redundancy cells 242A and 242B, 244A and 244B, and 246A and 246B.

According to an embodiment of the present invention, since the memory cells are on chips that are different from the fuse circuits for repairing the defective cells among the memory cells, the address programming process may be simplified by performing the address programming on, for example, the memory chip that includes the fuse circuits only. Since the address programming process is simplified, manufacturing costs and the manufacturing time may be saved.

While the present invention has been described with respect to the specific embodiments, it will be apparent to those skilled in the art that various changes and modifications may be made without departing from the spirit and scope of the invention as defined in the following claims.

What is claimed is:

1. A method for repairing a semiconductor memory device including a plurality of memory cells disposed in a plurality of first semiconductor memory chips and a fuse circuit for repairing defective cells among the memory cells, where the first semiconductor memory chips are different from a second memory chip including the fuse circuit, comprising:
   testing memory cells included in each of the plurality of first semiconductor chips;
      programming the fuse circuit included in the second semiconductor chip based on a result of the testing of the first semiconductor chips; and
   vertically stacking the first semiconductor chips and the second semiconductor chip after the programming of the fuse circuit.

2. The method of claim 1, further comprising:
   storing the test result.

3. The method of claim 1, wherein the testing of the memory cells is performed at a wafer level before stacking the first semiconductor memory chips on top of each other.

4. A method for repairing a semiconductor memory device including a plurality of memory cells disposed in a plurality of first semiconductor memory chips and a fuse circuit for repairing defective cells among the memory cells, where the first semiconductor memory chips are different from a second memory chip including the fuse circuit, comprising:
   vertically stacking the plurality of first semiconductor chips;
   testing memory cells included in each of the stacked first semiconductor chips;

programming the fuse circuit included in the second semiconductor chip based on a result of the testing of the first semiconductor chips; and vertically stacking the second semiconductor chip with the stacked first memory chips after the programming of the fuse circuit.

5. The method of claim 4, further comprising:

storing the integrated test result.

* * * * *